United States Patent [19]

Ogureck et al.

[11] 4,151,009
[45] Apr. 24, 1979

[54] FABRICATION OF HIGH SPEED TRANSISTORS BY COMPENSATION IMPLANT NEAR COLLECTOR-BASE JUNCTION

[75] Inventors: Frank M. Ogureck, Wyomissing, Pa.; Richard S. Payne, Piscataway, N.J.

[73] Assignee: Bell Telephone Laboratories, Incorporated, Murray Hill, N.J.

[21] Appl. No.: 869,167

[22] Filed: Jan. 13, 1978

[51] Int. Cl.² .................. H01L 21/265; H01L 29/72
[52] U.S. Cl. .................................... 148/1.5; 148/187; 357/20; 357/34; 357/91
[58] Field of Search ................ 357/20, 34, 91; 148/187, 1.5

[56] References Cited

U.S. PATENT DOCUMENTS

| | | | |
|---|---|---|---|
| 3,006,791 | 10/1961 | Webster, Jr. | 148/33 |
| 3,756,873 | 9/1973 | Kaiser | 148/187 |
| 4,045,251 | 8/1977 | Graul et al. | 148/1.5 |
| 4,047,217 | 9/1977 | McCaffrey et al. | 357/34 |

OTHER PUBLICATIONS

Payne et al., "Fully Ion-Implanted Bipolar Transistors" IEEE, vol. ED-21, 1974, 273.
Collins, "Effecting a High Collector Doping Gradient" IBM-TDB, 10 1967, 467.
Crowder et al., "Compensation ... of B. ... in Bipolar..." IBM-TDB, 15 1972, 956.
Aggarwel, "Emitter ... Impurity Concentrations" IBM-TDB, 19 (1976) 162.

*Primary Examiner*—L. Dewayne Rutledge
*Assistant Examiner*—Upendra Roy
*Attorney, Agent, or Firm*—Irwin Ostroff

[57] ABSTRACT

A high speed bipolar transistor is obtained by the use of ion implanted compensating impurities into the base region near the collector-base junction. This compensating implant significantly reduces the base width of the transistor with little reduction in total base charge. This results in a transistor which is reproducible and has a higher frequency response than those manufactured using standard semiconductor fabrication methods.

3 Claims, 2 Drawing Figures

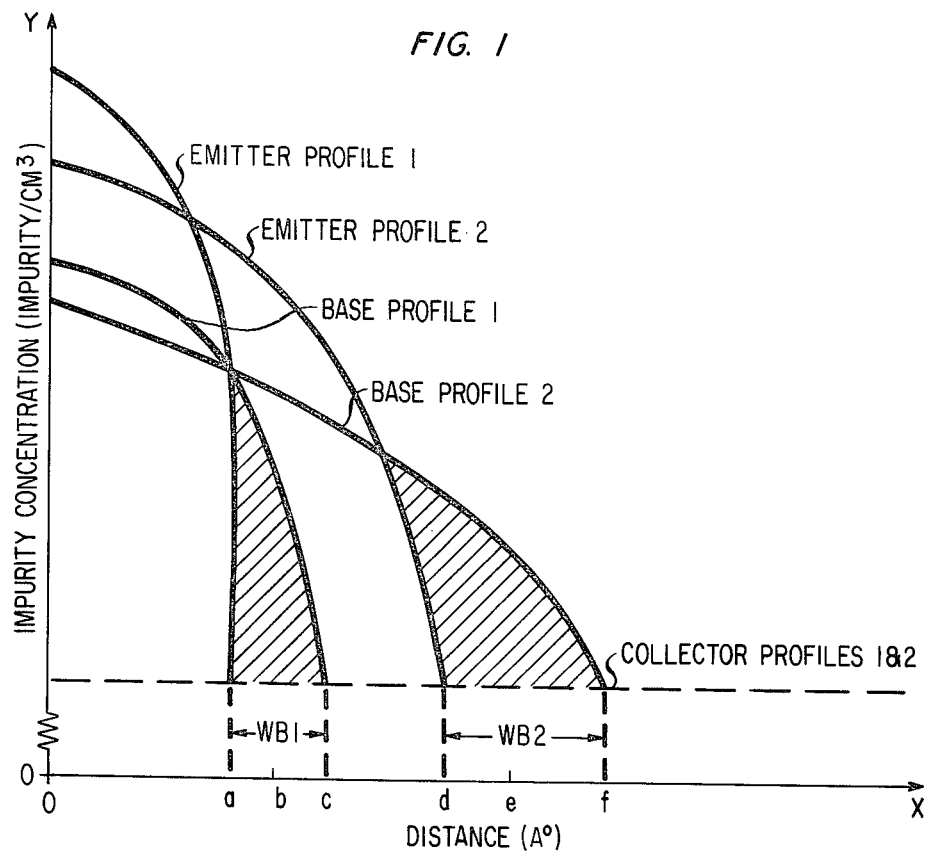
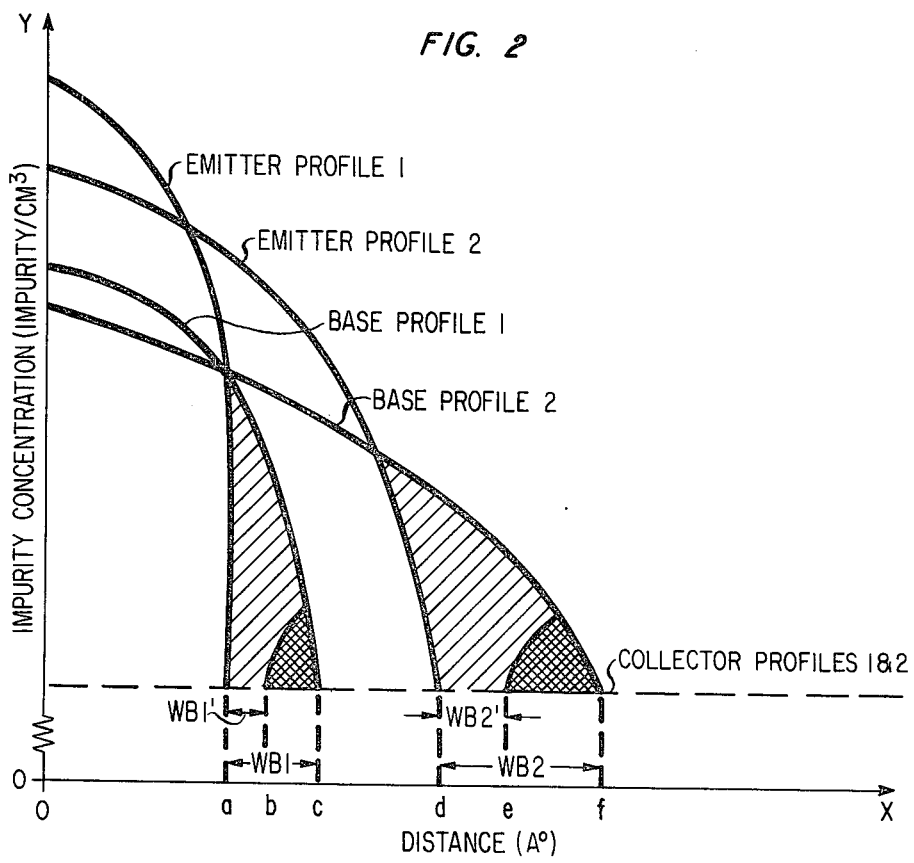

FABRICATION OF HIGH SPEED TRANSISTORS BY COMPENSATION IMPLANT NEAR COLLECTOR-BASE JUNCTION

BACKGROUND OF THE INVENTION

This invention relates to the fabrication of transistors, and in particular to the fabrication of high speed bipolar transistors.

It is well known that the response time of a bipolar transistor is directly related to the base width and the total base charge. In normally processed bipolar transistors the impurity concentration of the base near the base-collector junction is either gaussian, exponential, or error-function complement. The impurity concentration of the emitter is likewise describable mathematically. To a large extent the base width and the total base charge are inversely proportional to each other. In order to make the base width narrow, the total base doping must be decreased.

A narrow base width and a relatively high total base doping is desirable to produce transistors which have a good high frequency response and therefore high switching speeds. These conditions are difficult to achieve because of the inverse relationship between base width and total base doping.

It would be desirable to be able to fabricate a bipolar transistor having a relatively narrow base width and a relatively large amount of total base charge. This would result in a high speed transistor which has application in analog and digital circuits.

SUMMARY OF THE INVENTION

In one embodiment of the present invention a bipolar transistor is formed using standard base and emitter diffusions or ion implantation techniques. The base and emitter diffusions or ion implants are adjusted so as to result in as narrow a base width as in reproducible with a total base charge which is somewhat greater than what is predetermined to be an optimum value. A compensating donor of the same conductivity as the collector is formed in the portion of the base near the base-collector junction. This compensating donor converts a portion of the base near the base-collector junction to the conductivity of the collector and as a result significantly reduces the base width while decreasing the total base charge to the predetermined value. The frequency response (bandwidth-gain product), and correspondingly, the response time, of the resulting transistor is improved over transistors produced using standard semiconductor methods.

In another embodiment of the present invention, a bipolar transistor is formed using a standard diffusion or ion implantation technique with as narrow a base region as is reproducible. A compensating donor of the same impurity conductivity as the collector is formed in a portion of the base near the collector-base junction. This compensating donor significantly reduces the base width of the transistor while only somewhat reducing the total base charge. The reason the total base charge is only somewhat decreased is that the impurity concentration of the base is relatively low near the collector-base junction. The frequency response, and correspondingly the response time, of the resulting transistor structure is improved over transistors produced using standard semiconductor fabrication methods.

The methods of the present invention result in a transistor structure which is reproducible and has a higher frequency response than transistors fabricated using standard techniques.

These and other features of the present invention will be better understood from a consideration of the following detailed description taken in conjunction with the following drawings.

BRIEF DESCRIPTION OF THE DRAWINGS

FIG. 1 graphically illustrates standard emitter, base, and collector impurity concentration profiles of typical standard bipolar transistors; and FIG. 2 graphically illustrates the emitter, base and collector impurity concentration profiles of bipolar transistors fabricated in accordance with the methods of the present invention.

DETAILED DESCRIPTION

Referring now to FIG. 1 there is graphically illustrated the emitter, base and collector impurity concentrations versus distance from the semiconductor planar surface for two semiconductor planar bipolar transistors. The abscissa axis is distance in Angstroms from the surface of the planar semiconductor transistor ($x=0$ representing the planar surface). The ordinate axis is impurity concentration in impurities/cm$^{-3}$. The base and emitter impurity concentration profiles are essentially gaussian, exponential, or error-function complement.

The base of the first transistor begins at the intersection of emitter and base profiles 1 and ends at the intersection of base profile 1 and collector profile 1 ($x=b$). The base width, WB1, of the first transistor is the distance $x=c-a$. The sectioned area enclosed by emitter, base, and collector profiles 1 represents the total charge within the base of the first transistor. The base width of the second transistor, WB2, is the distance $x=f-d$. The sectioned area enclosed within emitter, base and collector profiles 2 represents the total charge within the base of the second transistor.

In the case of transistor 2, the emitter and base regions were diffused or ion implanted and then diffused into the planar surface of the semiconductor substrate for a longer period of time than the corresponding emitter and base regions of transistor 1.

In order to achieve high frequency transistors, the emitter and base diffusions or ion implantations and subsequent diffusions are performed shallower (by diffusing for a shorter period of time) in order to reduce the base width of the resulting transistor. To increase the frequency response of bipolar transistors, one normally selects what is believed to be an optimum base charge and then tries to achieve this base charge in as narrow a base width as is reasonably and reproducibly possible. As the base and emitter diffusions become shallower and shallower, they become extremely difficult to control and yields can drastically decline due to emitter-collector shorts when the emitter diffuses through the base and to the collector or when the emitter does not diffuse enough and the gain is too low.

Referring now to FIG. 2, there is graphically illustrated essentially the same emitter, base and collector impurity concentration profiles of FIG. 1, except that a portion of the sectioned areas defined by the emitter, base and collector profiles are illustrated cross-hatched in order to indicate that a portion of the base of each of the transistors near the collector-base junction has been doped with an impurity which has converted that portion of the base to the same conductivity type as the collector. The new effective base width of transistors 1 and 2, after they have been appropriately treated using the methods of the present invention, are illustrated as WB1' ($x=b-a$) and WB2' ($x=e-d$), respectively. These base widths are significantly smaller than WB1 and WB2, respectively. The total base charge of transistors 1 and 2 of FIG. 2 is less than that of transistors 1 and 2 of FIG. 1; however, the total base charge is only somewhat reduced because the portion of the base which was converted has significantly lower impurity concentration per unit volume than other portions of the base.

Once at optimum base charge is determined, a transistor having that base charge, and having a significantly smaller base width than is reproducibly fabricatable using standard techniques, is achieved by using a compensating ion implantation into a region of the base near the collector-base junction. This significantly reduces the base width to a size which is normally not reproducibly fabricatable and yet achieves the desired total base charge.

A semiconductor wafer of hundreds of n-p-n transistors was fabricated using standard techniques and having a surface emitter impurity concentration of $6\times10^{20}$ impurities/cm$^3$ and a total base charge of $3.5\times10^{12}$ B/cm$^2$. On a first quarter of the wafer there was no additional ion implantation in the base regions. On the second, third and fourth quarters of the wafers there were phosphorous ion implantations, at 600 keV, into the base regions of $5\times10^{11}$, $1\times10^{12}$, and $1.5\times10^{12}$ impurities/cm$^2$, respectively. The measured bandwidth-gain product of the transistors of the first quarter of the wafer was 5 GHz. That of the transistors of the other three quarters of the wafer were 6 GHz, 6.25 GHz, and 6.5 GHz, respectively. Accordingly, it has been found that the decreases in base widths have resulted in from 20 to 30% increases in the bandwidth-gain product. A significantly higher frequency responding transistor is thus made possible using the compensating base implant of the present invention.

The embodiments described herein are intended to be illustrative of the general method of the present invention. Various modifications are possible consistent with the spirit of the invention. For example, a p-n-p transistor can be fabricated using the methods of the present invention with the compensating impurity having the capability of converting a portion of the n-base to p-type collector.

What is claimed is:

1. A method of fabrication in a semiconductor device comprising the steps of:
    forming in a portion of a collector region of one conductivity type a base region of the opposite conductivity type using diffusion or ion implantation techniques;
    forming in a portion of the base region an emitter region of the same conductivity type as the collector using diffusion or ion implantation techniques; and
    characterized by the step of:
    converting a portion of the base region near the collector-base junction to the same conductivity as the collector such that the base width of the device is reduced.

2. The method of claim 1 wherein an ion implantation process is used to convert the portion of the base to the same conductivity type as the collector.

3. A method of fabricating a bipolar transistor having a base width which is narrower than can be reproducibly fabricated in manufacture using standard diffusion or ion implantation techniques comprising the steps:
    forming in a portion of the collector of one conductivity type a base region of opposite conductivity type using diffusion or ion implantation techniques;
    forming in a portion of the base region an emitter region having the same conductivity as the collector region using diffusion or ion implantation techniques; and
    characterized by the step of:
    ion implanting into a portion of the base region near the base-collector junction an impurity that converts that portion of the base region to the same conductivity as the collector region such that the base width of the transistor is significantly reduced from the value attained prior to this step.

* * * * *